US006972250B2

(12) United States Patent
Cabral, Jr. et al.

(10) Patent No.: US 6,972,250 B2
(45) Date of Patent: Dec. 6, 2005

(54) METHOD AND STRUCTURE FOR ULTRA-LOW CONTACT RESISTANCE CMOS FORMED BY VERTICALLY SELF-ALIGNED COSI2 ON RAISED SOURCE DRAIN SI/SIGE DEVICE

(75) Inventors: Cyril Cabral, Jr., Ossining, NY (US); Roy A. Carruthers, Stromville, NY (US); Kevin K. Chan, State Island, NY (US); Jack O. Chu, Manhasset Hill, NY (US); Guy Moshe Cohen, Mohegan Lake, NY (US); Steven J. Koester, Ossining, NY (US); Christian Lavoie, Ossining, NY (US); Ronnen A. Roy, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/419,888

(22) Filed: Apr. 22, 2003

(65) Prior Publication Data

US 2003/0219971 A1 Nov. 27, 2003

Related U.S. Application Data

(62) Division of application No. 10/156,782, filed on May 24, 2002, now Pat. No. 6,690,072.

(51) Int. Cl.[7] .......................................... H01L 21/4763
(52) U.S. Cl. ...................................... 438/618; 438/683
(58) Field of Search ................................ 438/597, 602, 438/618, 682–683

(56) References Cited

U.S. PATENT DOCUMENTS 5,818,100 A * 10/1998 Grider et al. ............... 257/616
5,955,745 A 9/1999 Yamazaki
6,214,679 B1 4/2001 Murthy et al.
6,235,568 B1 * 5/2001 Murthy et al. .............. 438/231

* cited by examiner

*Primary Examiner*—David S. Blum
(74) *Attorney, Agent, or Firm*—Casimer K. Salys, Esq.; McGinn IP Law Group, PLLC

(57) ABSTRACT

A method (and structure) of forming a vertically-self-aligned silicide contact to an underlying SiGe layer, includes forming a layer of silicon of a first predetermined thickness on the SiGe layer and forming a layer of metal on the silicon layer, where the metal layer has a second predetermined thickness. A thermal annealing process at a predetermined temperature then forms a silicide of the silicon and metal, where the predetermined temperature is chosen to substantially preclude penetration of the silicide into the underlying SiGe layer.

18 Claims, 6 Drawing Sheets

METHOD AND STRUCTURE FOR ULTRA-LOW CONTACT RESISTANCE CMOS FORMED BY VERTICALLY SELF-ALIGNED COSI2 ON RAISED SOURCE DRAIN SI/SIGE DEVICE

This Application is a Divisional Application of U.S. patent application Ser. No. 10/156,782, filed on May 24, 2002, now U.S. Pat. No. 6,690,072.

BACKGROUND OF THE INVENTION

1. Field of the Invention

The present invention generally relates to a process and structure for achieving very low silicide contact resistance in a Complementary Metal Oxide Semiconductor (CMOS) device. Specifically, a sacrificial silicon layer is deposited on a doped low barrier SiGe source/drain (S/D) region, followed by deposition of a metal such as cobalt. A precisely-defined annealment forms a silicide interface having vertical self-alignment relative to the underlying SiGe layer.

2. Description of the Related Art

Silicon Metal Oxide Semiconductor Field Effect Transistor (MOSFET) scaling requires the continuous reduction of the gate length, gate dielectric thickness, and higher substrate doping. As these entities improve, the intrinsic device resistance scales below 1000 ohm-$\mu$m, leading to faster devices. However, as these entities scale down in size the silicide used to contact the source and drain becomes an increasingly limiting factor on device speed as related to the parasitic contact resistance of silicide to silicon in the source/drain (S/D) contacts. This is because minimizing the silicide interface resistivity depends mainly on maximizing the S/D doping level, which is already at saturation level in current CMOS technology.

As devices scale smaller, the contact resistance only increases as the silicide/silicon contact area becomes smaller. Thus, not only in relative terms, but also in absolute terms the contact resistance increases as devices scale below 0.1 $\mu$m, placing a severe limitation on potential device improvement obtained by scaling other parameters.

The problem remains to achieve lower source/drain contact resistance as CMOS devices continue to scale down in size.

SUMMARY OF THE INVENTION

In view of the foregoing problems, drawbacks, and disadvantages of the conventional systems, it is an object of the present invention to provide a structure (and method) for achieving very low silicide source/drain contact resistance in a CMOS device.

It is another object of the present invention to form $CoSi_2$ immediately adjacent to the SiGe source/drain (S/D), but without consumption of the SiGe resulting in a single-phase contact microstructure (i.e., vertically self-aligned with the underlying SiGe layer).

It is still another object of the present invention to provide a simple process to form a low resistance contact to low band-gap SiGe devices, thereby to provide lower resistance than conventional Si S/D CMOS where the band-gap is higher.

It is still another object of the present invention to overcome the problem of reaction of metal with SiGe which forms undesirable multiphase microstructure by using a sacrificial Si overlayer within which to form the silicide.

It is still another object of the present invention to teach, for ease of manufacturing, a wide process window in terms of Co metal thickness and Si layer thickness in which the process of the present invention will work.

It is still another object of the present invention to teach, also for ease of manufacturing, a wide process window in terms of the annealing temperature to form $CoSi_2$.

In a first aspect of the present invention, a method is described herein of forming a vertically self-aligned silicide contact to an underlying SiGe layer, including formation of a layer of silicon of a first predetermined thickness on the SiGe layer and formation of a layer of metal on the silicon layer, where the metal layer has a second predetermined thickness. A thermal annealing process at a predetermined temperature then forms a silicide of the silicon and metal at a first predetermined temperature selected from a temperature range having a lower threshold temperature and an upper threshold temperature. The lower threshold temperature comprises a temperature at which the silicon layer interacts with the metal layer to form the first silicide. The upper temperature threshold comprises a temperature at which the first silicide forms from silicon atoms from the SiGe layer.

In a second aspect of the present invention, a method is described herein of forming a silicide contact for a metal-oxide semiconductor (MOS) transistor, the MOS transistor comprising a source, a drain, and a gate structure on a layer of SiGe, including forming a layer of silicon of a first predetermined thickness in a region to have the silicide contact, applying a layer of metal over the silicon, a thickness of the metal layer being a second predetermined thickness, and providing a thermally annealing process at a predetermined temperature, thereby forming a silicide of the silicon and metal, where the predetermined temperature is chosen to substantially inhibit penetration of the silicide into the underlying SiGe layer.

In a third aspect of the present invention, a structure of a MOSFET (Metal Oxide Semiconductor Transistor) is described herein, including a source region formed on a layer of SiGe, a drain region formed on a layer of SiGe, and a silicide layer formed over at least one of the source region and the drain region, wherein the silicide layer is essentially vertically self-aligned with the underlying layer of SiGe.

In a fourth aspect of the present invention, described herein is the structure of a silicon-based electronic device including a region of a layer of SiGe and a silicide layer formed over the region, wherein the silicide layer is essentially vertically self-aligned with the underlying layer of SiGe.

The present invention, therefore, provides the method and structure of a vertically self-aligned source/drain silicide contact having the advantages of lowering resistance by using an underlying layer of SiGe to reduce the Schottky barrier height while maintaining low contact resistance characteristic of silicide without the problems typically present with a silicide/SiGe interface

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
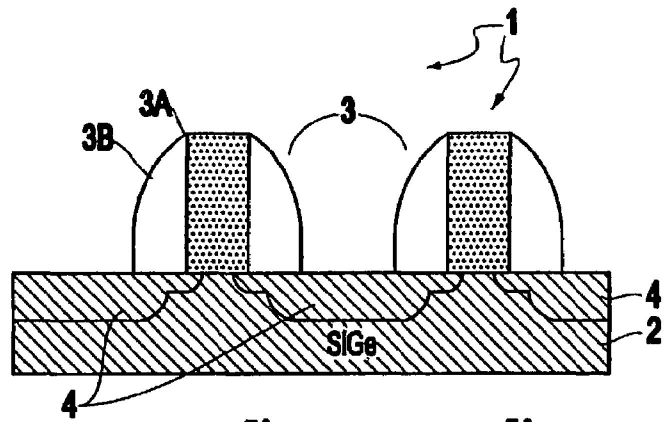
FIG. 1A exemplarily shows a CMOS structure as fabricated on an underlying layer of SiGe.

Referring now to the drawings, and more particularly to FIG. 1A through FIG. 5, a preferred embodiment will now be described. Although the following discussion demonstrates the present invention as involving cobalt, there is no intent to confine the invention to this metal specifically. Nor is there intent to confine the present invention to the MOS structure exemplarily described herein.

One way in which contact resistance can be improved is by lowering the Schottky barrier height between the silicide and source/drain (S/D) regions. Simulations suggest for $TiSi_2$ or $CoSi_2$, that the contact resistance could be reduced by about a factor of 5–10 by lowering the barrier height from about 0.6 eV for conventional $CoSi_2$/Si to about 0.3–0.5 eV for $CoSi_2$ in contact with SiGe, where the composition of the SiGe alloy ranges from 20% Ge to 100% Ge. As an example, this could result in a total parasitic resistance from silicide reducing from about a few hundred Ohm-micron to several tens of Ohm-micron for a device where total intrinsic resistance is less than 1000 Ohm-micron.

Thus, the contribution of silicide contact resistance to total device resistance could drop from almost 50% to less than 10% for a low barrier height contact. This can be accomplished by forming the silicide on a SiGe alloy whose barrier height is dependent on Ge content, but which is in the 0.35–0.5 eV range for Ge fraction of about 20–70%. Similar values would be obtained for the case of $TiSi_2$/SiGe.

Moreover, the use of SiGe alloys in the S/D in CMOS devices has become increasingly attractive, such as for fabrication of strained silicon channel devices. Thus, the use of SiGe S/D is now practical and manufacturable.

However, conventional silicide materials such as Co and Ti do not typically form single phase silicides when reacted with SiGe substrates, thereby resulting in precipitates and non uniform contacts. Thus, ideally to form a low resistance contact, silicide should be directly on top of the SiGe without reacting with any of the SiGe S/D. However, this is not possible in a conventional self-aligned silicide (self-aligned suicide is typically referred to as "salicide") process which entails reaction of a blanket elemental metal such as Co or Ti with silicon in the S/D to form a metal silicide.

Conventional wisdom shows that one cannot make direct contact to SiGe by using a conventional salicide process for the major silicide-forming materials such as Co and Ti. The presence of Ge in the substrate causes the formation of extra Ge-containing phases, resulting in interface or island precipitates, which is not a condition ideal for good contact resistance. Thus, the problem of making a low resistance vertically self-aligned contact to SiGe remains.

Ideally, for a manufacturable low resistance S/D contact to SiGe, the lateral self-alignment should be provided by a salicide process where the metal reacts with the silicon-containing substrate and also a vertical self-alignment, such that the silicide bottom interface abuts the SiGe top interface without consuming any of the SiGe, which would cause unwanted precipitates. The present invention provides the first known way to satisfy both criteria.

Figure 1B:
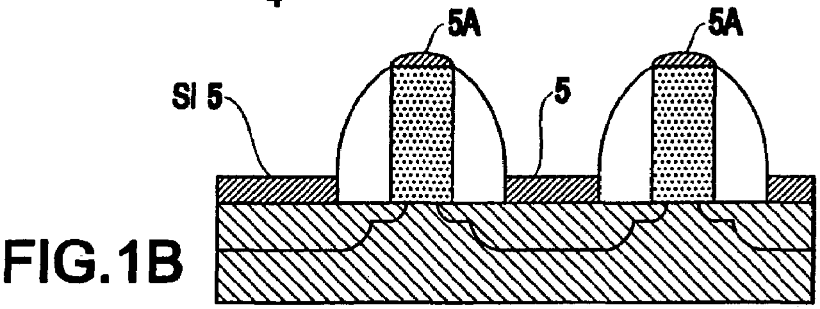
FIG. 1B shows deposition of silicon in the source and drain regions to provide raised silicon sacrificial areas.
Figure 1C:
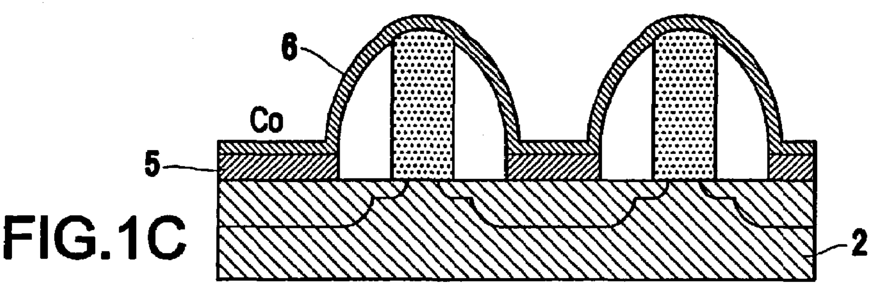
FIG. 1C shows deposition of cobalt to become the basis of the silicide.
Figure 1D:
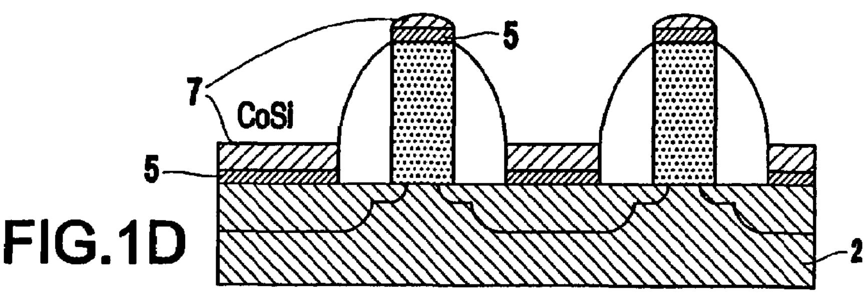
FIG. 1D shows the result of a low temperature anneal and etching away of the cobalt that has not formed a surface layer of CoSi.
Figure 1E:
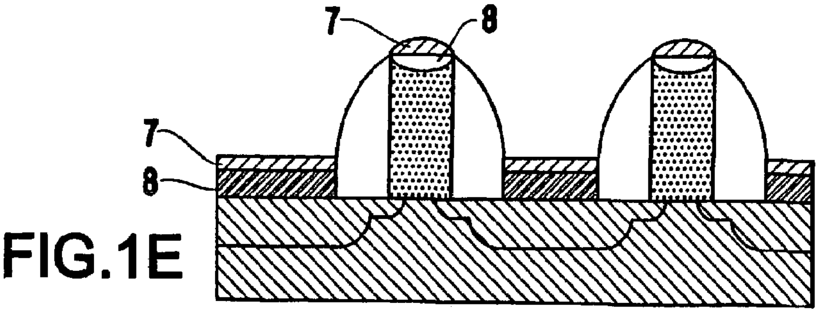
FIG. 1E shows the result of a high temperature anneal to form $CoSi_2$ to complete the vertical self alignment with the SiGe underlying layer.
Figure 1F:
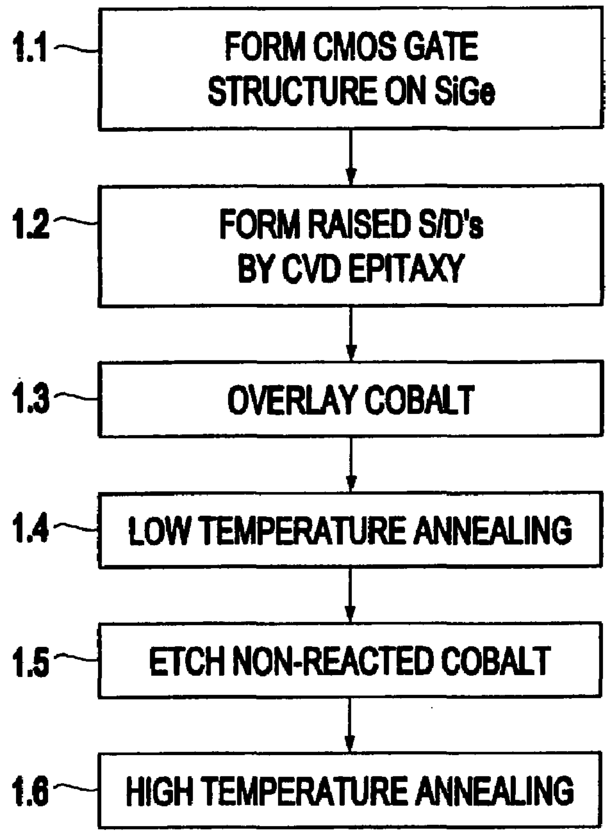
FIG. 1F shows an exemplary flowchart of the steps 1.1–1.6 of the method described in FIGS. 1A through 1E.

As shown in FIGS. 1A through 1E and the flowchart of FIG. 1F, the current invention forms a laterally and vertically self-aligned silicide contact to SiGe substrate by combining three key elements.

First, a controlled thickness of silicon is placed on top of the SiGe source/drain (S/D) area. Second, a controlled amount of Co metal (or other similar metal) is placed on top the silicon. Finally, a precisely defined thermal annealing process causes a silicide to be formed selectively in only the silicon layer and not the underlying SiGe layer, thereby providing the vertical self alignment with the SiGe layer. A non-limiting exemplary technique of the present invention is first demonstrated in FIGS. 1A through 1F, followed by a discussion using the remaining figures to explain the rationale behind the technique and the details for selection of the parameters.

As a more detailed description of an exemplary embodiment, in FIG. 1A the CMOS devices 1 are shown as having been partially fabricated, for example, on an underlying SiGe layer 2. Typically, this SiGe might be a layer on top of a silicon carrier wafer. The exemplary partial fabrication includes gate structures 3 and doped source/drain regions 4. The gate structure 3 typically includes gate 3A, which would typically be polysilicon or metal, and sidewall spacer 3B, which would typically be $SiO_2$ or $Si_3N_4$.

Shown in FIG. 1B, a silicon overlayer 5 is formed (e.g., grown) on the SiGe S/D regions, for example, by selective silicon epitaxy accomplished by commercial CVD equipment. This process allows controlled growth of a silicon layer 5 in the S/D regions. In this example, the gates 3 also receive the silicon layer 5A. In alternate embodiments, the S/D doping can be performed after selective silicon growth.

As an alternative, the Si overlayer could be formed non-selectively on the SiGe layer before transistor gate formation. However, typically, during gate formation and sidewall formation, the silicon layer becomes substantially thinned, resulting in a much thinner Si overlayer on the SiGe S/D. Thus, to practice the present, invention one would need to accurately account for this thinning during initial overlayer growth in order to produce the correct Si thickness before $CoSi_2$ formation since, as will shortly be demonstrated, the thickness of the Si is a key parameter of the present invention. A non-limiting, exemplary value for the Si layer thickness would be 20 nm, a value used in the result discussed later in FIGS. 4 and 5.

In FIG. 1C, a cobalt (Co) overlayer 6 is provided by conventional blanket deposition such as sputtering. The details of the deposition is not important since all metal will be selectively etched away that is not destined to become silicide in S/D regions 5 and, optionally, the gate regions 5A. It is, however, preferable that the deposition result in planar coverage for these specific regions in order to provide a uniform thickness. As to be discussed shortly, the thickness of the cobalt layer is related to the thickness of the silicon layer. As an example, for a silicon layer with thickness 20 nm, a typical value of the cobalt layer thickness would be 8 nm. The derivation of this value will be explained later.

Dimensions of the device itself are not critical to the present invention except that the height of the sidewall 3B be sufficient to prevent bridging between the gate 3A and the S/D regions as raised in height by the additional silicon interlayer.

It is noted that, in the exemplary embodiment, a polysilicon gate is shown. As is well known in the art, the material for the gate is optionally metal. After reading the description herein, it should be obvious that the composition of the gate may determine some of the details of implementing the present invention. That is, if metal is used and it is desired to preclude a silicide formation, then it would be obvious that the silicon regions 5A should not be formed on the gate structures, or that prior to forming the silicon interlayer 5, a passivation layer be applied over any exposed metal for which a silicide formation is not desired.

The key that provides the vertical self-alignment feature of the present invention is a high temperature (i.e., 650–800° C.) annealing step that causes the cobalt layer 6 to interact selectively with only the silicon interlayer 5 (FIG. 1C) to form the desired structure in which a $CoSi_2$ layer directly contacts the underlying SiGe. As shortly to be explained, the selected temperature is high enough to allow the formation of $CoSi_2$ using the silicon from the silicon interlayer 5 but not so high as to allow an interaction with the underlying SiGe layer 2. This technique automatically solves the precipitation problem of the prior art.

That is to say, the inventors have discovered that, within a certain ratio of thicknesses for the cobalt and interlayer silicon layer and within a certain temperature range, it is possible to form a silicide using only the cobalt and silicon interlayer and that the underlying SiGe layer does not enter into the silicide formation unless the anneal temperature has exceeded an upper temperature threshold.

This high temperature annealing could be done immediately following the cobalt layer deposition, but an optional additional lower temperature annealing has been found to possibly be useful to better ensure that the layer 6 of cobalt is removed from all areas except where the silicide formation is desired, i.e., the S/D regions 4 and (possibly) the gate contacts 3A (see FIG. 1A). Of particular concern is that cobalt be completely removed from the sidewalls 3B so that no metal remains to cause shorts between the S/D regions 4 and the gate contacts 3A.

In this optional step, a lower temperature (e.g., approximately 500° C.) annealing results in a CoSi layer 7 over the silicon interlayer 5 of the S/D regions. Because of this difference in composition, the pure cobalt is then selectively etched away, leaving cobalt only in the form of the alloy CoSi in the desired regions 7, as shown in FIG. 1D. It is noted that an even lower temperature can be used for this low temperature anneal to result in $Co_2Si$. The key to this optional step is that the cobalt to be removed remains a pure metal, whereas the cobalt in regions to have silicide undergo a reaction so that the reacted cobalt phase ($Co_2Si$ or CoSi) is not etched away and can be further reacted subsequently to form $CoSi_2$.

Thus, as shown in FIG. 1D, by using an etchant selective to Co but not to CoSi, all non-reacted cobalt is then etched away. Such etchants are well known in the art and may include, for example, $H_2O_2$:$H_2SO_4$ in a ratio of 10:1, or the like. Also as seen in FIG. 1D and depending upon the exact ratio of thicknesses of the cobalt and silicon layers, the low temperature annealing process may leave a portion of the silicon underlayer 5. Any of such remaining residual silicon layer 5 will be converted into a $CoSi_2$ layer 8, as shown in FIG. 1E by subsequently applying the higher-temperature annealing step mentioned earlier.

That is, in the condition shown in FIG. 1E, the higher temperature annealing (e.g., approximately 650–800° C.) completes the silicide formation of any remaining silicon interlayer 5 to form the $CoSi_2$ layer 8. The details of the higher-temperature annealing step would be obvious to one of ordinary skill in the art upon having read the description of the present invention. Typically, the higher temperature is achieved by simply ramping the temperature up rapidly, holding for several hundred seconds or less, and then rapidly ramping back down.

FIG. 1F is a flowchart of the steps 1.1–1.6 corresponding to FIG. 1A through FIG. 1E. In step 1.1 the CMOS gate structure has been formed on the SiGe layer, followed by the formation in step 1.2 of the raised S/D regions. In step 1.3, the cobalt layer is deposited. If there is a low temperature annealing, it is done in step 1.4, followed by the cobalt selective etch step 1.5 and concluded by the higher temperature annealing step 1.6. If the low temperature annealing is not performed, the selective etching step 1.5 would follow the high temperature annealing step 1.6.

In principle, one could also accomplish a result similar to the present invention by use of selective CVD silicide formation (e.g., selective $TiSi_2$ CVD). For example, previous work has shown that $TiSi_2$ can be deposited selectively directly on the S/D of a silicon CMOS device. Because the CVD process involves using precursor gases that contain silicon, in principle there is no need to consume silicon in the S/D area to form silicide, so that silicide can form with no net consumption of the S/D.

However, in practice some silicon from the S/D is always consumed in the CVD $TiSi_2$ process, and thus if this were practiced on a SiGe S/D there would likely be attack of the SiGe during CVD and the possibility of precipitates. Further, the basic selective CVD $TiSi_2$ process has not been reduced to a practical manufacturing process for silicide contacts as yet, for other reasons too numerous to detail here.

The key phenomenon which allows the current invention is that cobalt can react selectively with silicon compared to SiGe. This mechanism will now be described in more detail by reference to FIGS. 2–5.

Figure 2:
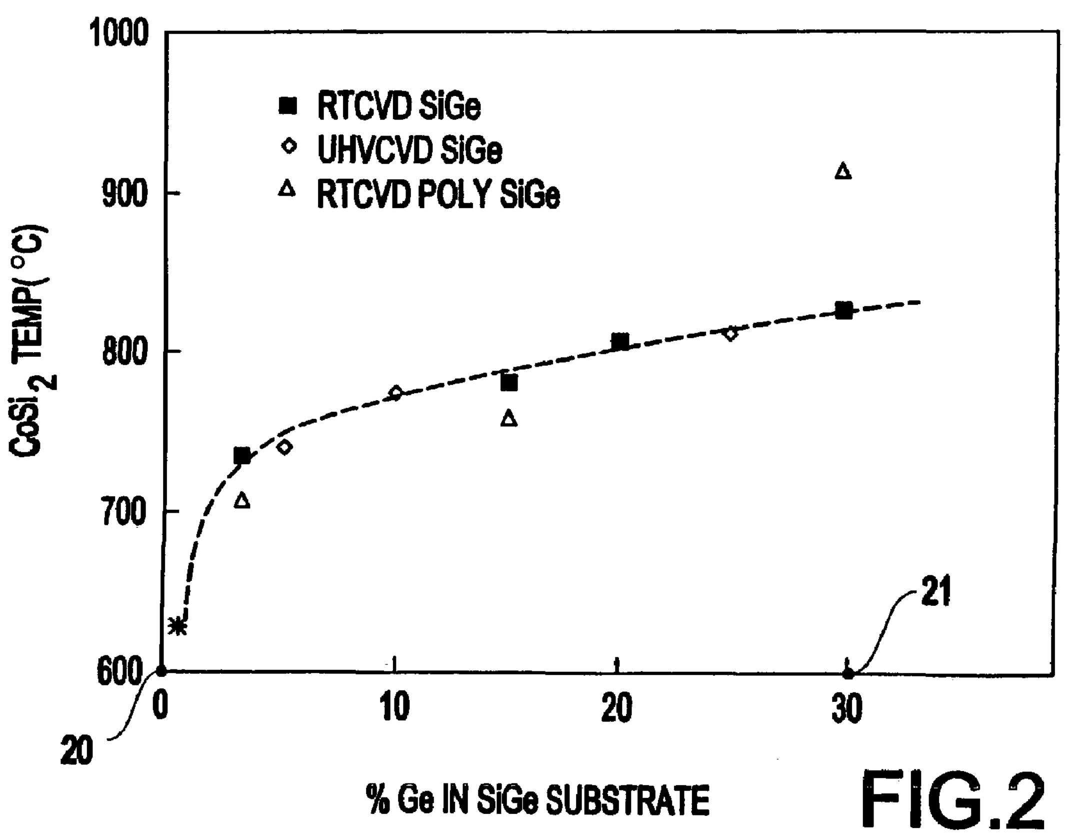
FIG. 2 shows the $CoSi_2$ formation temperature as a function of Ge content in the underlying SiGe substrate layer.

Specifically, in FIG. 2 is shown an analysis of the $CoSi_2$ formation temperature as a function of Ge content in SiGe substrates for the case where Co is directly deposited on SiGe. The origin 20 represents SiGe at 0% Ge (i.e., pure silicon). The second point 21 represents 30% Ge (70% Si). As can be seen, the formation temperature increases by up to 150° C. or more for a Ge fraction approaching 30%.

This phenomenon has been previously reported, but has been given various conflicting explanations. It is known that during reaction of Co on SiGe the initially-formed CoSi phase can contain Ge, but the final $CoSi_2$ phase does not dissolve Ge. Therefore, Ge must be precipitated from the CoSi phase before $CoSi_2$ formation occurs. Thus, in addition to delaying the $CoSi_2$ formation, the presence of Ge in the substrate causes excess precipitation of Ge after $CoSi_2$ formation, resulting in a poor microstructure.

Figure 3A:
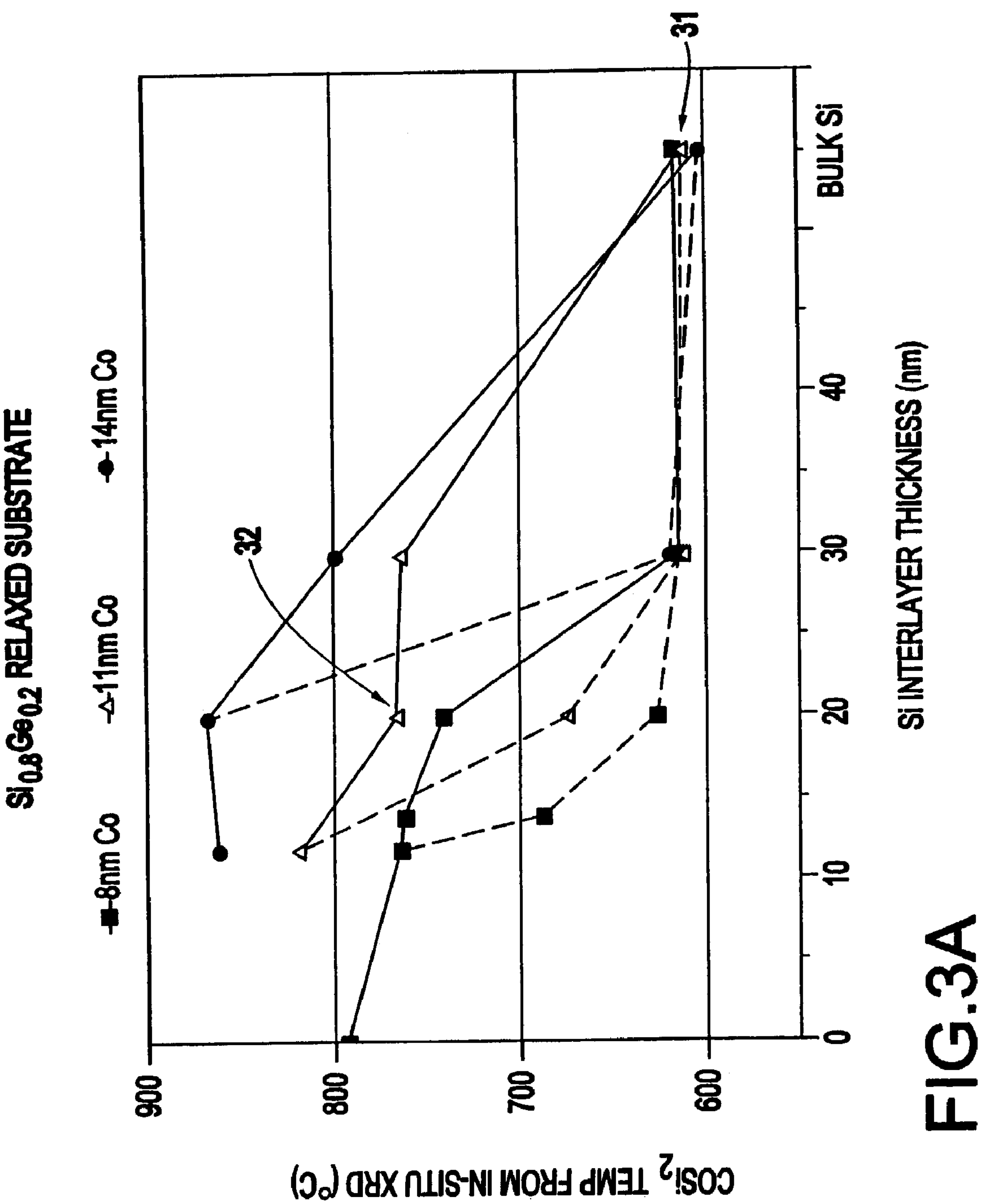
FIG. 3A shows $CoSi_2$ formation temperature where different thickness layers of silicon are deposited on SiGe and the effect of these three different thickness layers of cobalt.

FIG. 3A shows the $CoSi_2$ formation temperature determined by x-ray diffraction for the case where Si interlayers are deposited on a $Si_{0.8}Ge_{0.2}$ relaxed substrate before deposition of Co. An interesting feature is that for intermediate Si thickness, two $CoSi_2$ formation temperatures 31, 32 are found. These temperatures signify the point at which the $CoSi_2$ x-ray signal is most rapidly increasing, indicating phase formation. Between the transitions, the $CoSi_2$ signal does not change significantly. Also, the separation of the transitions can be quite large, as much as 180° C. The inventors interpret this phenomenon in the following manner.

The low temperature transition 31 represents the formation of $CoSi_2$ in the Si interlayer, while the high temperature transition 32 represents the formation of $CoSi_2$ in the underlying SiGe. At intermediate temperatures, little or no $CoSi_2$ formation takes place. In addition, it is found that the double transition only occurs when $t_{CoSi2}>t_{Si}>t_{CoSi}$, where t represents thickness. That is, the silicon thickness range where the silicon layer is thick enough to form pure CoSi from the fully reacted Co, but not thick enough to contain the $CoSi_2$ without reaction within the SiGe.

Relating this discussion back to FIGS. 1A–1F, it should be emphasized that the low temperature transition 31 is not the optional low-temperature annealing step 1.4 shown in FIG. 1F. A typical value for the optional low-temperature annealing step is 500° C., which is well below the low temperature transition 31 shown in FIG. 3A.

Rather, the low temperature transition 31 is the threshold temperature for the high temperature annealing step 1.6, since according to the teaching of the present invention, this is the transition temperature at which the cobalt and the silicon interlayer form $CoSi_2$. The high temperature transition 32 is an upper limit for the high temperature annealing step 1.6, since according to the present invention, this transition 32 represents a temperature at which the underlying SiGe layer becomes involved in $CoSi_2$ formation, which condition is to be avoided to preclude precipitates at the SiGe interface.

In quantitative terms, the above thickness relation may be represented as $3.66(t_{Co})>t_{Si}>1.83(t_{Co})$. It was initially proposed that in reaction of Co deposited directly on SiGe, the Ge that is extruded from the CoSi before $CoSi_2$ formation may reside at the interface between CoSi and the SiGe substrate and act as a diffusion barrier to $CoSi_2$ formation, which requires Si from the underlying SiGe. This was thought to be responsible for the delay in $CoSi_2$ formation on SiGe substrates.

However, current findings of the inventors show that delay in $CoSi_2$ formation clearly takes place even when the above mechanism cannot be present, and this result is key to the current invention. The interlayers in FIG. 3A where double transitions occur are thick enough to contain pure CoSi with no dissolved Ge. Therefore, no Ge interface layer can precipitate out of the CoSi phase. Nevertheless, it was observed by the inventors that $CoSi_2$ formation is inhibited at the SiGe interface, which allows formation of $CoSi_2$ in contact with SiGe without precipitation of extra phases.

Thus, in the present invention the ideal structure of FIG. 1E can be realized by adhering to the following criteria:

1) Growing a selective Si layer with subsequent Co layer such that $3.66(t_{Co})>t_{Si}>1.83(t_{Co})$; and 2) Subsequently, annealing is done at a temperature T, where T(CoSi2 in Si)<T<T(CoSi2 in SiGe).

For practical conditions, T ranges from about 650 C. to 850 C. or so. This ensures that the $CoSi_2$ bottom interface fully consumes the pure Si layer, but does extend into the SiGe layer, resulting in a planar interface substantially precipitate-free. The upper temperature, at which $CoSi_2$ begins to form in the SiGe layer, will depend on the Ge fraction in the SiGe layer, and could be much higher than the example shown for 20% Ge composition. These two conditions achieve the vertical self alignment with the underlying SiGe layer in the present invention.

Figure 3B:
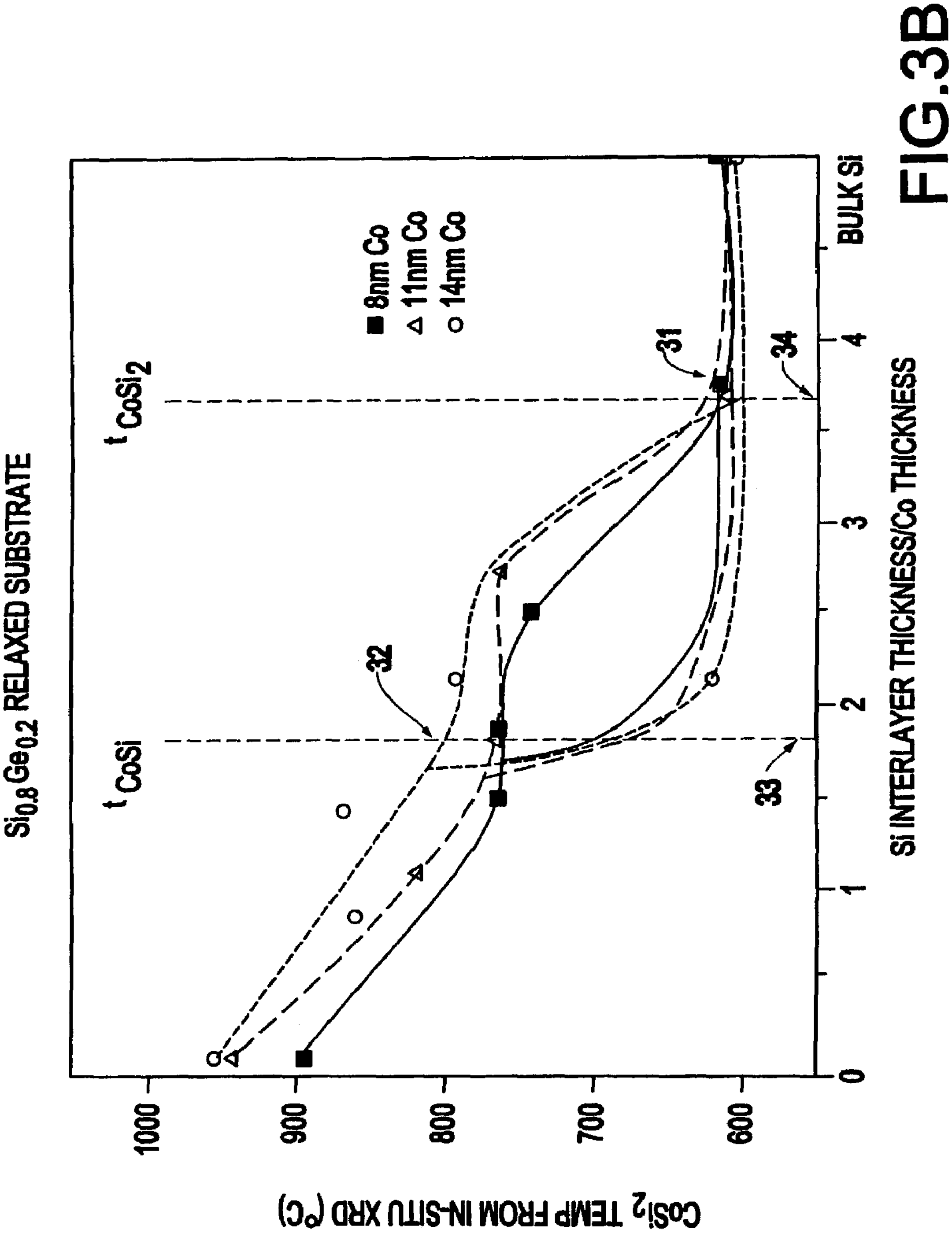
FIG. 3B shows the present invention in which $CoSi_2$ formation temperature is plotted as a function of the ratio of Si/Co thickness.

The plot in FIG. 3B perhaps better illustrates the significance of the above numbers for the present invention. Similar to FIG. 3A, this figure again plots on the vertical axis the $CoSi_2$ transition temperature for three thicknesses of cobalt (8 nm, 11 nm, 14 nm) for a layer of SiGe in the ratio of 80% Si to 20% Ge. In constrast to FIG. 3A, the horizontal axis is now based on the ratio of Si to Co thickness.

In FIG. 3B, the low temperature $CoSi_2$ transition 31 and upper temperature $CoSi_2$ transition 32 are again visible. It should be noted that FIG. 3B shows that the upper transition 32 is a bit more variable than the lower transition 31, when viewed as a function of the thickness of the cobalt layer. The significance of the thickness ratio of $t_{Si}/t_{Co}$ becomes more visible in FIG. 3B. As earlier mentioned, the dual $CoSi_2$ formation temperatures 31, 32 are found only in the intermediate ratios, that is, above the lower ratio threshold 33 (theoretically, where the ratio is 1.83) in which the silicon interlayer is entirely converted into CoSi and the upper threshold 34 (theoretically, a ratio of 3.66) in which the interlayer silicon has been entirely converted into $CoSi_2$. Since the desired structure at the SiGe interface involves $CoSi_2$ rather than CoSi, it should be obvious that one would prefer a ratio above the lower threshold 33, as was shown in FIG. 1E.

Figure 4A:
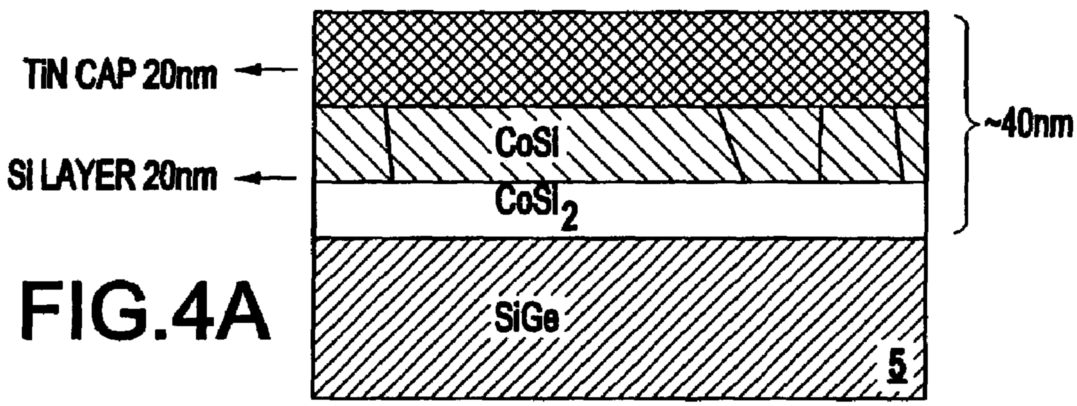
FIG. 4A shows the predicted result at annealing temperature of 700° C. of a 20 nm layer silicon on a 20 nm layer of 80% Si/20% Ge, using 8 nm of cobalt.
Figure 4B:
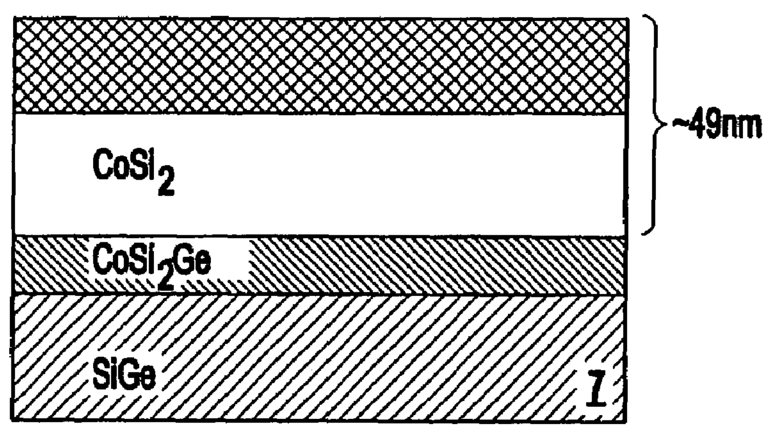
FIG. 4B shows this same layer of FIG. 4A at 800° C. annealing temperature.

FIGS. 4A and 4B are illustrations of the expected results when applying the present invention. FIG. 4A shows the expected multilayer structure after annealing of a 20 nm TiN/8 nmCo/20 nm Si/20 nm Si20% Ge structure at 700° C. The 20 nm TiN layer is left on top to prevent oxidation and for clarity. A SEM micrograph of the actual sample clearly showed underneath the TiN layer a uniform layer of about 16–20 nm thickness. This layer represented the cobalt suicides and corresponded within measurement error to the initial 20 nm Si interlayer thickness. The silicide layer contained $CoSi_2$ at the bottom and CoSi at top, but the individual layers were not distinguished. For full $CoSi_2$ formation, the total thickness of the layers including TiN would be about 50 nm, clearly more than is observed. So it is concluded from the micrograph that full consumption of the silicon layer has taken place, but with no penetration of silicide into the SiGe substrate.

FIG. 4B shows the expected result that, as the annealing temperature is increased to 800° C., the $CoSi_2$ will penetrate into the underlying SiGe. This situation was confirmed by an SEM micrograph.

Figure 5:
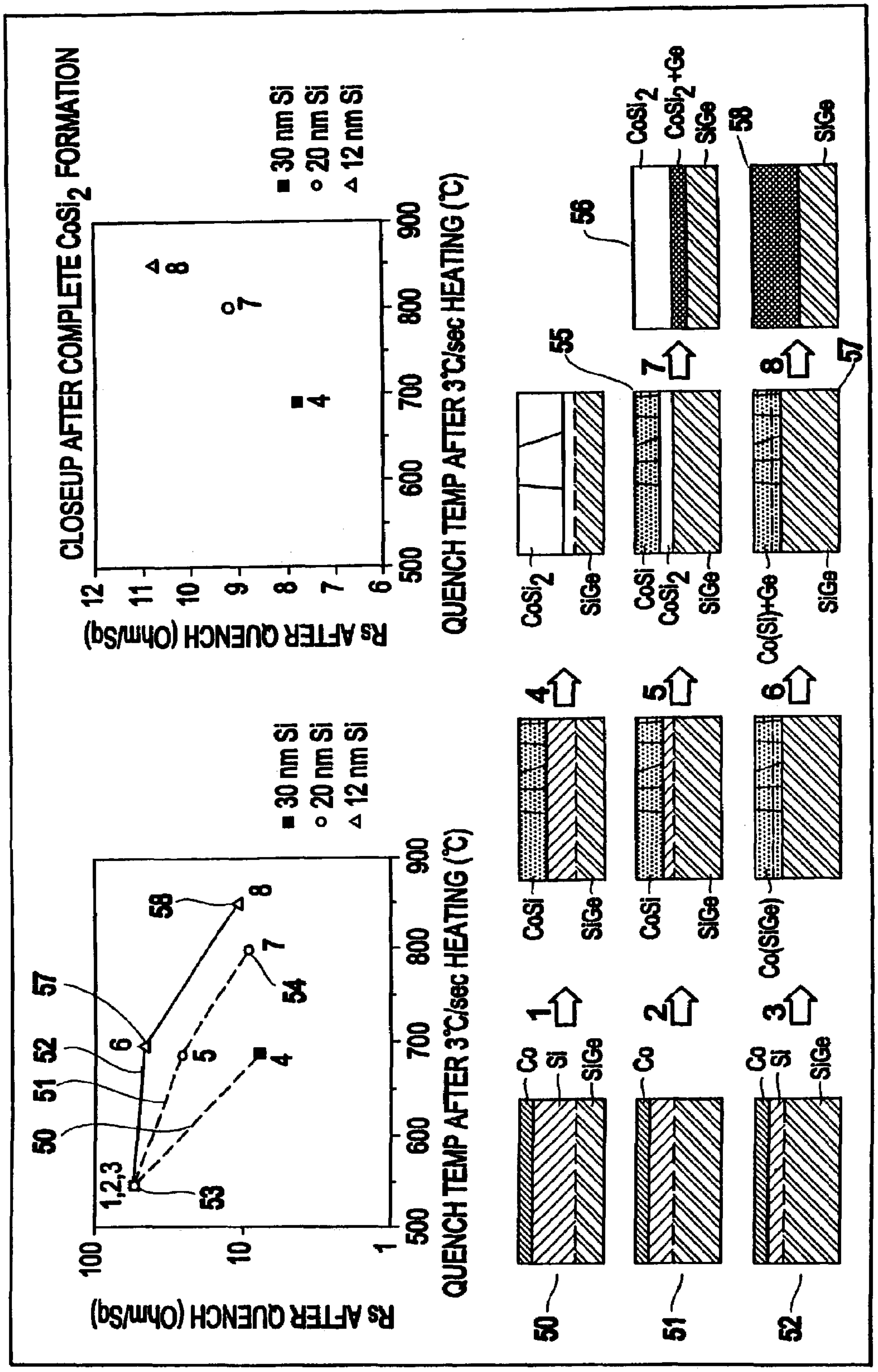
FIG. 5 shows the measured electrical results and structural schematic of three different thickness layers of silicon, using 8 nm of cobalt.

This procedure was further confirmed by measurements of resistance values after annealing. FIG. 5 shows the result of three thicknesses of silicon, 30 nm (50), 20 nm (51), and 12 nm (52) using 8 nm cobalt. For 8 nm Co thickness, if the silicidation is indeed restricted to the 20 nm layer, it should produce about 9 nm $CoSi_2$ and 12 nm CoSi. This is supported by FIG. 5 which shows that after 700 C. annealing, the 20 nm Si sample (51) has a resistance which is intermediate between the case for pure CoSi (53) and pure $CoSi_2$ (54), indicating a mixture of $CoSi_2$ and CoSi.

FIG. 5 also shows the resistance behavior for 8 nm Co deposited 12 nm (52) and 30 nm (50) Si interlayers layers with SiGe on the bottom. At 700 C., the 30 nm Si case has low resistance indicating full $CoSi_2$ formation (the Si thickness required to completely react 8 nm Co to $CoSi_2$ is about 29 nm). However, such a case would leave about 2 nm Si between the SiGe substrate and the $CoSi_2$, perhaps enough to increase contact resistance. The 12 nm case indicates that a 700 C. anneal leaves the resistance high, nearly the same as pure CoSi, indicating little or no $CoSi_2$ formation. It is noted that the 20 nm measurement for 700° C. (55) and 800° C. (56) are the two samples shown in FIGS. 4A and 4B.

The SEM measurement for the 12 nm Si interlayer (52) annealing at 700° C. (57) indicates that a layer is formed (not including the 20 nm TiN layer) whose total thickness is about 15–20 nm. This indicates that some of the SiGe substrate (3–8 nm) has been consumed during CoSi formation. Assuming this layer to include only cobalt monosilicide with dissolved Ge ($Co\{Si,Ge\}_1$), the expected thickness is about 17 nm, within the range observed in the SEM. Thus, in comparison to the FIG. 4A case of 20 nm Si, the 12 nm Si layer (52) is not thick enough to form pure CoSi (tSi>15 nm), and silicidation is not prevented in the SiGe layer. This is because CoSi phase will dissolve Ge in its structure.

Finally, after annealing the 12 nm silicon layer at a temperature high enough to completely form $CoSi_2$ (58), the micrograph showed that the microstructure is very rough. FIG. 5 also shows that the rough microstructure is reflected in a higher $CoSi_2$ resistance compared to the case where $CoSi_2$ is entirely contained in the Si layer.

Thus, the 20 nm Si interlayer represents the ideal thickness in combination with 8 nm Co and 700 C. annealing to obtain a $CoSi_2$/SiGe planar interface with low contact resistance. The presence of the 12 nm CoSi on top of the $CoSi_2$ layer should not alter contact resistance to the SiGe substrate. Furthermore, the 25 Ohm/Sq sheet resistance seen in FIG. 5, though higher than normal will not impact series resistance significantly, because the series resistance is dominated by contact resistance. In practice, to minimize residual CoSi on top, $t_{Si}$ can be chosen closer to 3.66 $t_{Co}$. In fact, during tungsten contact formation on top of the silicide subsequently, a couple of nanometers of silicide can be typically removed, resulting in substantial removal of the CoSi layer.

In sum, the present invention provides a simple way to fabricate a low contact resistance device with $CoSi_2$ abutting a SiGe S/D formed by tailoring of selective Si interlayer thickness, Co thickness, and $CoSi_2$ annealing temperature. The structure is not limited in absolute thickness of the Si or Co layers, but allows a wide process window where the Si/Co ratio be between 1.83 and 3.66. For values somewhat less than 3.66, the presence of residual CoSi is not considered detrimental because the method ensures that the $CoSi_2$ layer forms directly on the SiGe providing a low contact resistance.

Thus, the current invention provides a simple process to form a low resistance contact to a low band-gap SiGe device, providing lower resistance than conventional Si S/D CMOS where the band-gap is higher. It preserves the ability to use the conventional commercial laterally self-aligned silicide process (salicide) which is formed by reaction of a blanket metal with exposed S/D regions to form a silicide.

The present invention overcomes the problem of reaction of metal with SiGe, which forms undesirable multiphase microstructure, by using a sacrificial Si overlayer within which to form the silicide. It ensures that a vertically self-aligned silicide process occurs which places the bottom silicide interface at the top of the original. SiGe/Si interface, by taking advantage of the difference in silicide reaction temperatures.

Because of the necessity of only forming a thin $CoSi_2$ layer adjacent to the SiGe to establish low contact resistance, there is a wide process window in terms of Co metal thickness and Si layer thickness in which the process will work. In addition, the present invention allows for a large process window in terms of annealing temperature to form $CoSi_2$.

The invention, although described for CMOS, can be extended to form low resistance contacts to other devices that employ SiGe S/D, such as modulation doped field effect transistors (MODFET), strained silicon channel CMOS, and silicon-on-insulator devices containing SiGe.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of forming a vertically self-aligned silicide contact to an underlying SiGe layer, said method comprising:

forming a silicon layer to selectively cover a layer of SiGe in one or more regions, said silicon layer having a first predetermined thickness;

forming a metal layer to cover said layer of SiGe and said silicon layer, said metal layer having a second predetermined thickness;

forming a first silicide of said silicon layer and said metal layer by a first thermal annealing process at a first predetermined lower temperature; and forming a second silicide of said silicon layer and said metal layer by a second thermal annealing process at a second predetermined higher temperature, said first predetermined temperature selected from a temperature range having a lower threshold temperature comprising a temperature at which said silicon layer interacts with said metal layer to form any silicide, said second predetermined temperature selected from a higher temperature range having an upper temperature threshold comprising a temperature at which any silicide formed from said metal layer interacts with said SiGe layer, wherein:

said first predetermined thickness and said second predetermined thickness provide thicknesses appropriate for forming said vertically self-aligned characteristic of said silicide contact, in which said silicon layer is essentially completely converted into one of said one first silicide and said second silicide, each of said first silicide and said second silicide is essentially composed of silicon and said metal and is essentially free of precipitates, and an interface between said SiGe layer and said first and second silicides is essentially free of precipitates.

2. The method of claim 1, further comprising:

removing, using a selective etching process, any of said metal layer that is exposed and has not formed a silicide.

3. The method of claim 1, wherein said metal comprises cobalt, said first predetermined thickness lies within a range of 1.8 to 3.7 times said second predetermined thickness, and said upper temperature threshold is approximately 850° C.

4. The method of claim 1, wherein said metal comprises cobalt and said first predetermined thickness lies within a range of 1.8 to 3.7 times said second predetermined thickness.

5. The method of claim 3, wherein said higher temperature range comprises approximately 650° C. to 850° C. and said second silicide comprises $CoSi_2$.

6. The method of claim 1, wherein said metal comprises cobalt, said first silicide comprises CoSi, and said first predetermined temperature is below approximately 600° C.

7. The method of claim 1, further comprising:

removing, prior to performing said second thermal annealing process, by a selective etching process, any of said metal layer that is exposed and has not formed said first silicide.

8. A method of forming a silicide contact for an electronic device having a structure based on a layer of SiGe, said method comprising:

forming a layer of silicon having a first predetermined thickness on a layer of SiGe in a region to have a silicide contact;

applying a layer of metal over said silicon, a thickness of said metal layer being a second predetermined thickness, wherein said first predetermined thickness and said second predetermined thickness are selected to result in an overlying silicide structure in which said silicon layer will substantially be completely converted into one or more silicides directly contacting said underlying SiGe layer;

providing a first thermal annealing process to form a first silicide with said metal at a predetermined lower temperature, said predetermined lower temperature being a temperature at which silicon interacts with said metal to form any silicide; and providing a second thermal annealing process at a predetermined higher temperature, said higher temperature being a temperature at which silicon interacts with said metal to form a second silicide but lower than a temperature at which said SiGe layer interacts with said first or second silicides, wherein said first silicide is and said second silicide are essentially composed of silicon and said metal and are essentially free of precipitates and an interface between said SiGe layer and said first and second silicides is essentially free of precipitates.

9. The method of claim 8, wherein said metal layer comprises colbalt.

10. The method of claim 8, further comprising:

selectively removing any of said metal that is exposed and has not reacted to form a silicide.

11. The method of claim 9, wherein said first predetermined thickness lies within a range of 1.8 to 3.7 times a thickness of said cobalt layer.

12. The method of claim 9, wherein said silicon layer is formed in only preselected regions, said method further comprising:

performing said lower temperature annealing for forming said first silicide;

etching away any of said metal that has not reacted to form said first silicide; and performing said higher temperature annealing for forming said second silicide.

13. The method of claim 12, wherein said higher temperature is below approximately 850° C.

14. The method of claim 8, wherein said electronic device comprises a metal-oxide semiconductor (MOS) transistor, said MOS transistor comprises a source, a drain, and a gate structure, and said silicide contact is selectively formed for at least one of said source, drain, and gate structure.

15. The method of claim 14, further comprising:

forming a MOS gate structure on a layer of SiGe; and using said gate structure as a mask to implant ions to form a source diffusion region and a drain diffusion region in said layer of SiGe.

16. A method of forming a vertically self-aligned silicide contact to an underlying SiGe layer, said method comprising:

forming a silicon layer to selectively cover a layer of SiGe in one or more regions;

forming a metal layer to cover said layer of SiGe and said silicon layer; and forming a first silicide of said silicon layer and said metal layer by a first thermal annealing process at a predetermined lower temperature comprising a temperature at which said silicon layer interacts with said metal layer to form any silicide;

forming a second silicide of said silicon layer and said metal layer by a second thermal annealing process at a predetermined higher temperature, an upper limit of said higher temperature comprising a temperature at which any silicide formed from said metal interacts with said SiGe layer, wherein:

said first silicide and said second silicide are essentially composed of silicon and said metal and are essentially free of precipitates, and an interface between said SiGe layer and said first and second silicides is essentially free of precipitates.

17. The method of claim 16, wherein said metal comprises cobalt.

18. The method of claim 17, wherein said upper limit of said higher temperature is approximately 850° C.

* * * * *

UNITED STATES PATENT AND TRADEMARK OFFICE
CERTIFICATE OF CORRECTION

PATENT NO. : 6,972,250 B2 Page 1 of 1
DATED : December 6, 2005
INVENTOR(S) : Cyril Cabral, Jr. et al.

It is certified that error appears in the above-identified patent and that said Letters Patent is hereby corrected as shown below:

Title page,
Item [75], Inventors, change “State Island, NY” to -- Staten Island, NY --; and Column 11,
Line 34, delete “IS”.

Signed and Sealed this

Sixth Day of June, 2006

JON W. DUDAS
*Director of the United States Patent and Trademark Office*